(12) United States Patent
Parkinson et al.

(10) Patent No.: US 6,795,338 B2
(45) Date of Patent: Sep. 21, 2004

(54) MEMORY HAVING ACCESS DEVICES USING PHASE CHANGE MATERIAL SUCH AS CHALCOGENIDE

(75) Inventors: Ward D. Parkinson, Boise, ID (US); Tyler A. Lowrey, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 27 days.

(21) Appl. No.: 10/319,769

(22) Filed: Dec. 13, 2002

(65) Prior Publication Data

US 2004/0114413 A1 Jun. 17, 2004

(51) Int. Cl.⁷ .............................................. G11C 11/00
(52) U.S. Cl. ...................................................... 365/163
(58) Field of Search ................................ 365/163, 154; 438/102; 257/42

(56) References Cited

U.S. PATENT DOCUMENTS

| | | | |
|---|---|---|---|
| 3,629,863 A | | 12/1971 | Neale |
| 3,872,492 A | * | 3/1975 | Robbins ...................... 257/66 |
| 5,296,716 A | | 3/1994 | Ovshinsky et al. |
| 5,818,749 A | * | 10/1998 | Harshfield ................... 365/105 |
| 5,923,582 A | * | 7/1999 | Voss ............................ 365/154 |
| 2004/0032789 A1 | * | 2/2004 | Ngo et al. ............. 365/230.03 |

OTHER PUBLICATIONS

Shanks et al., "All–Film Ovonic Memory", Energy Conversion Devices, Inc., Technical Report AFAL–TR–70–263, Dec. 1970.

Hwang, Y.N., Hong, J.S., Lee, S.H., Ahn, S.J., Jeong, G.T., Koh, G.H., Kim H.J., Jeong, W.C., Lee, S.Y., Park, J.H., Ryoo, K.C.., Horii, H., Ha, Y.H., Yi, J.H., Cho, W.Y., Kim, Y.T., Lee, K.H., Joo, S.H., Park, S.O., Jeong,U.I., Jeong, H.S. and Kim, Kinam, "Completely CMOS–Compatible Phase–Change Nonvolatile RAM Using NMOS Cell Transistors," presented at 2003 19th IEEE Non–Volatile Semiconductor Memory Workshop, Monterey, California, Feb. 26–20, 2003.

Ha, Y.H., Yi, J.H., Horii, H., Park, J.H., Joo, S.H., Park, S.O., Chung, U–In and Moon, J.T., "An Edge Contact Type Cell for Phase Change RAM Featuring Very Low Power Consumption," presented at IEEE 2003 Symposium on VLSI Technology, Kyoto, Japan, Jun. 12–14, 2003.

Hwang, Y.N., Hong, J.S., Lee, S.H., Ahn, S.J., Jeong, G.T., Koh, G.H., Oh, J.H., Kim H.J., Jeong, W.C., Lee, S.Y., Park, J.H., Ryoo, K.C.., Horii, H., Ha, Y.H., Yi, J.H., Cho, W.y., Kim, Y.T., Lee, K.H., Joo, S.H., Park, S.O., Chung, U.I., Jeong, H.S. and Kim, Kinam, "Full Integration and Reliability Evaluation of Phase–change RAM Based on 0.24 mm–CMOS Technologies," presented at IEEE 2003 Symposium on VLSI Technology, Kyoto, Japan, Jun. 12–14, 2003.

(List continued on next page.)

Primary Examiner—VanThu Nguyen
(74) Attorney, Agent, or Firm—Trop, Pruner & Hu, P.C.

(57) ABSTRACT

Briefly, in accordance with an embodiment of the invention, a memory is provided. The memory may include a memory element and a first access device coupled to the memory element, wherein the first access device comprises a first chalcogenide material. The memory may further include a second access device coupled to the first access device, wherein the second access device comprises a second chalcogenide material.

23 Claims, 11 Drawing Sheets

OTHER PUBLICATIONS

Horii, H., Yi, J.H., Park, J.H., Ha, Y.H., Baek, I.G., Park, S.O., Hwang, Y.N., Lee, S.H., Kim, Y.T., Lee, K.H., Chung, U–In and Moon, J.T., "A Novel Cell Technology Using N–doped GeSbTe Films for Phase Change RAM," presented at IEEE 2003 Symposium on VLSI Technology, Kyoto, Japan, Jun. 12–14, 2003.

T.J. Coutts, "Active and Passive Thin Film Devices", Industrial Science Reasearch Centre Cranfield Institute of Technology, Cranfield, Bedford, England, Academic Press, 1978, pps. 282–296.

U.S. patent application, pending, 09/608,162, filed Jun. 30, 2000, Tyler Lowrey (P8845).

U.S. patent application, pending, 10/231,974, filed Aug. 30, 2002, Tyler Lowrey (P8845X).

U.S. patent application, pending, filed herewith, Tyler Lowrey (P14855).

* cited by examiner

MEMORY HAVING ACCESS DEVICES USING PHASE CHANGE MATERIAL SUCH AS CHALCOGENIDE

BACKGROUND

Phase change memory devices use phase change materials, i.e., materials that may be electrically switched between a generally amorphous and a generally crystalline state, for electronic memory application. One type of memory element utilizes a phase change material that may be, in one application, electrically switched between a structural state of generally amorphous and generally crystalline local order or between different detectable states of local order across the entire spectrum between completely amorphous and completely crystalline states. The state of the phase change materials are also non-volatile in that, when set in either a crystalline, semi-crystalline, amorphous, or semi-amorphous state representing a resistance value, that value is retained until changed by another programming event, as that value represents a phase or physical state of the material (e.g., crystalline or amorphous).

A transistor or a diode may be connected to the phase change material and may serve as a select device to access the phase change material during programming or read operations. The transistor or diode is typically formed in or on the top surface of a silicon single crystal substrate. Transistors may take up a relatively large portion of the memory chip, and therefore may increase the memory cell size, thereby adversely affecting the memory capacity and cost/bit of a memory chip.

BRIEF DESCRIPTION OF THE DRAWINGS

The subject matter regarded as the invention is particularly pointed out and distinctly claimed in the concluding portion of the specification. The present invention, however, both as to organization and method of operation, together with objects, features, and advantages thereof, may best be understood by reference to the following detailed description when read with the accompanying drawings in which:

Figure 1:
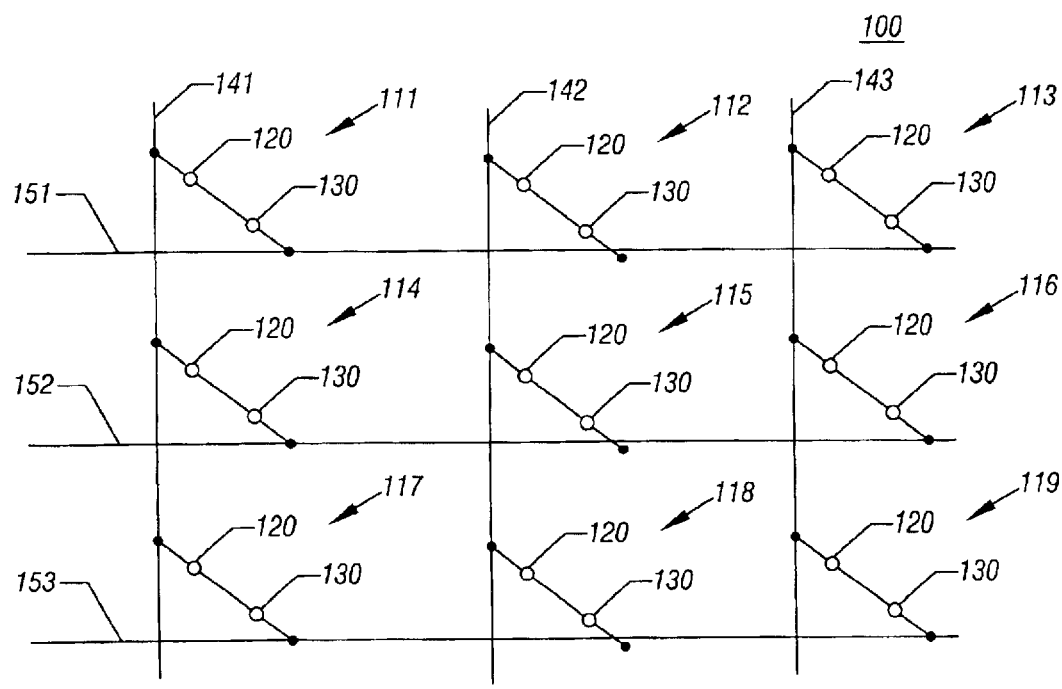
FIG. 1 is a schematic diagram illustrating a memory in accordance with an embodiment of the present invention.

It will be appreciated that for simplicity and clarity of illustration, elements illustrated in the figures have not necessarily been drawn to scale. For example, the dimensions of some of the elements are exaggerated relative to other elements for clarity. Further, where considered appropriate, reference numerals have been repeated among the figures to indicate corresponding or analogous elements.

DETAILED DESCRIPTION

Phase change memory devices use phase change materials, i.e., materials that may be electrically switched between a generally amorphous and a generally crystalline state, for electronic memory application. One type of memory element utilizes a phase change material that may be, in one application, electrically switched between a structural state of generally amorphous and generally crystalline local order or between different detectable states of local order across the entire spectrum between completely amorphous and completely crystalline states. The state of the phase change materials are also non-volatile in that, when set in either a crystalline, semi-crystalline, amorphous, or semi-amorphous state representing a resistance value, that value is retained until changed by another programming event, as that value represents a phase or physical state of the material (e.g., crystalline or amorphous).

A transistor or a diode may be connected to the phase change material and may serve as a select device to access the phase change material during programming or read operations. The transistor or diode is typically formed in or on the top surface of a silicon single crystal substrate. Transistors may take up a relatively large portion of the memory chip, and therefore may increase the memory cell size, thereby adversely affecting the memory capacity and cost/bit of a memory chip.

DETAILED DESCRIPTION

In the following detailed description, numerous specific details are set forth in order to provide a thorough understanding of the present invention. However, it will be understood by those skilled in the art that the present invention may be practiced without these specific details. In other instances, well-known methods, procedures, components and circuits have not been described in detail so as not to obscure the present invention.

In the following description and claims, the terms "coupled" and "connected," along with their derivatives, may be used. It should be understood that these terms are not intended as synonyms for each other. Rather, in particular embodiments, "connected" may be used to indicate that two or more elements are in direct physical or electrical contact with each other. "Coupled" may mean that two or more elements are in direct physical or electrical contact. However, "coupled" may also mean that two or more elements are not in direct contact with each other, but yet still co-operate or interact with each other.

Turning to FIG. 1, an embodiment of a memory 100 is illustrated. Memory 100 may include a 3×3 array of memory cells 111–119, wherein memory cells 111–119 each include a select device 120 and a memory element 130. Although a 3×3 array is illustrated in FIG. 1, the scope of the present invention is not limited in this respect. Memory 100 may have a larger array of memory cells.

In one embodiment, memory elements 130 may comprise a phase change material. In this embodiment, memory 100 may be referred to as a phase change memory. A phase change material may be a material having electrical properties (e.g. resistance, capacitance, etc.) that may be changed through the application of energy such as, for example, heat, light, voltage potential, or electrical current. Examples of a phase change material may include a chalcogenide material or an ovonic material.

An ovonic material may be a material that undergoes electronic or structural changes and acts as a semiconductor when subjected to application of a voltage potential, an electrical current, light, heat, etc. An ovonic material may be used in a memory element or in an electronic switch. A chalcogenide material may be a material that includes at least one element from column VI of the periodic table or may be a material that includes one or more of the chalcogen elements, e.g., any of the elements of tellurium, sulfur, or selenium.

Memory 100 may include column lines 141–143 and row lines 151–153 to select a particular memory cell of the array during a write or read operation. Column lines 141–143 and row lines 151–153 may also be referred to as address lines since these lines may be used to address memory cells 111–119 during programming or reading. Column lines 141–143 may also be referred to as bit lines and row lines 151–153 may also be referred to as word lines.

Memory elements 130 may be connected to row lines 151–153 and may be coupled to column lines 141–143 via select devices 120. Therefore, when a particular memory cell (e.g., memory cell 115) is selected, voltage potentials may be applied to the memory cell's associated column line (e.g., 142) and row line (e.g., 152) to apply a voltage potential across the memory cell.

Select device 120 may be used to access memory element 130 during programming or reading of memory element 130. Select device 120 may operate as a switch that is either "off" or "on" depending on the amount of voltage potential applied across the memory cell. The off state may be a substantially electrically nonconductive state and the on state may be a substantially conductive state. For example, select device 120 may have a threshold voltage and if a voltage potential less than the threshold voltage of select device 120 is applied across select device 120, then select device 120 may remain "off" or in a relatively high resistive state so that little or no electrical current passes through the memory cell. Alternatively, if a voltage potential greater than the threshold voltage of select device 120 is applied across select device 120, then select device 120 may "turn on," i.e., operate in a relatively low resistive state so that electrical current passes through the memory cell. In other words, select device 120 may be in a substantially electrically nonconductive state if less than a predetermined voltage potential, e.g., the threshold voltage, is applied across select device 120. Select device 120 may be in a substantially conductive state if greater than the predetermined voltage potential is applied across select device 120. Select device 120 may also be referred to as an access device, an isolation device, or a switch.

In one embodiment, select device 120 may comprise a switching material such as, for example, a chalcogenide or an ovonic material, and may be referred to as an ovonic threshold switch, or simply an ovonic switch. The switching material of select device 120 may be a material in a substantially amorphous state positioned between two electrodes that may be repeatedly and reversibly switched between a higher resistance "off" state (e.g., greater than about ten mega-ohms) and a relatively lower resistance "on" state (e.g., about zero ohms) by application of a predetermined electrical current or voltage potential. In this embodiment, select device 120 may be a two terminal device that may have a current-voltage (I-V) characteristic similar to a phase change memory element that is in the amorphous state. However, unlike a phase change memory element, the switching material of select device 120 may not change phase. That is, the switching material of select device 120 may not be a programmable material, and as a result, select device 120 may not be a memory device capable of storing information. For example, the switching material of select device 120 may remain permanently amorphous and the I-V characteristic may remain the same throughout the operating life. An example of an I-V characteristic of select device 120 is shown in FIG. 2.

Figure 2:
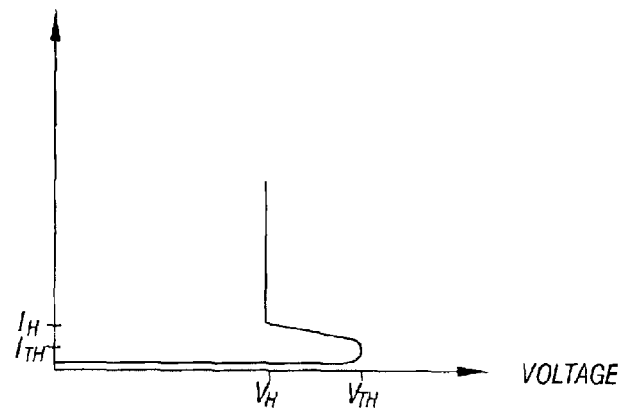
FIG. 2 is a diagram illustrating a current-voltage characteristic of a select device.

Turning to FIG. 2, in the low voltage or low electric field mode, i.e., where the voltage applied across select device 120 is less than a threshold voltage (labeled $V_{TH}$), select device 120 may be "off" or nonconducting, and exhibit a relatively high resistance, e.g., greater than about 10 mega-ohms. Select device 120 may remain in the off state until a sufficient voltage, e.g., $V_{TH}$, is applied, or a sufficient current is applied, e.g., $I_{TH}$, that may switch select device 120 to a conductive, relatively low resistance on state. After a voltage potential of greater than about $V_{TH}$ is applied across select device 120, the voltage potential across select device 120 may drop ("snapback") to a holding voltage potential, labeled $V_H$. Snapback may refer to the voltage difference between $V_{TH}$ and $V_H$ of a select device.

In the on state, the voltage potential across select device 120 may remain close to the holding voltage of $V_H$ as current passing through select device 120 is increased. Select device 120 may remain on until the current through select device 120 drops below a holding current, labeled $I_H$. Below this value, select device 120 may turn off and return to a relatively high resistance, nonconductive off state until the $V_{TH}$ and $I_{TH}$ are exceeded again.

Although the scope of the present invention is not limited in this respect, in one embodiment, select device 120 may have a threshold voltage ($V_{TH}$) of about 5.3 volts, a holding voltage ($V_{TH}$) of about 0.8 volts, a threshold current ($I_{TH}$) of about 4 nano-amps, and a holding current ($I_H$) of about 100 nano-amps. By adjusting the thickness and type of material, the $V_{TH}$ may be about 2 volts and the holding voltage about one volt. This may allow the snapback to be less than the $V_{TH}$ of the series memory element to avoid the possibility of read disturb if the snapback exceeds $V_{TH}$ of the memory element, encouraging it to turn on and drive the capacitance of the column and row lines, adversely passing current which could reduce the resistance of the memory element when the memory element is in the reset state.

Figure 3:
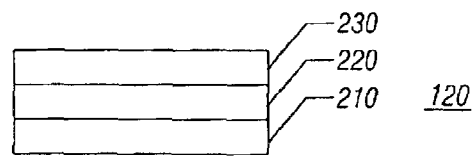
FIG. 3 is a cross-sectional view of a select device in accordance with an embodiment of the present invention.

FIG. 3 illustrates an embodiment of select device 120. In this embodiment, select device 120 may include a bottom electrode 210 and a switching material 220 overlying bottom electrode 210. In other words, switching material 220 may be formed over and contacting bottom electrode 210. In addition, select device 120 may include a top electrode 230 overlying switching material 220.

Although the scope of the present invention is not limited in this respect, bottom electrode 210 may be a thin film material having a film thickness ranging from about 20 Angstroms (Å) to about 2000 Å. In one embodiment, the thickness of electrode 210 may range from about 100 Å to about 1000 Å. In another embodiment, the thickness of electrode 210 may be about 300 Å. Suitable materials for bottom electrode 210 may include a thin film of titanium (Ti), titanium nitride (TiN), titanium tungsten (TiW), carbon (C), silicon carbide (SiC), titanium aluminum nitride (TiAlN), titanium silicon nitride (TiSiN), polycrystalline silicon, tantalum nitride (TaN), some combination of these films, or other suitable conductors or resistive conductors compatible with switching material 220.

Although the scope of the present invention is not limited in this respect, switching material 220 may be a thin film material having a thickness ranging from about 20 Å to about 2000 Å. In one embodiment, the thickness of switching material 220 may range from about 200 Å to about 1000 Å. In another embodiment, the thickness of switching material 220 may be about 500 Å.

Switching material 220 may be formed overlying bottom electrode 210 using a thin film deposition technique such as, for example, a chemical vapor deposition (CVD) process or a physical vapor deposition (PVD). Switching material 220 may be a thin film of a chalcogenide material or an ovonic material in a substantially amorphous state that may be repeatedly and reversibly switched between a higher resistance "off" state and a relatively lower resistance "on" state by application of a predetermined electrical current or voltage potential. Switching material 220 may not be a programmable material capable of storing information. In other words, switching material 220 may be a nonprogammable material.

Although the scope of the present invention is not limited in this respect, switching material 220 may comprise a chalcogen other than oxygen. In one embodiment, switching material 220 may comprise tellurium and/or selenium. In another embodiment, switching material 220 may comprise silicon (Si), tellurium (Te), arsenic (As), and germanium (Ge), or combinations of these elements. In other embodiments, a composition for switching material 220 may include an alloy of silicon (Si), tellurium (Te), arsenic (As), germanium (Ge), and indium (In) or an alloy of Si, Te, As, Ge, and phosphorous (P).

Although the scope of the present invention is not limited in this respect, in one example, the composition of switching material 220 may comprise a Si concentration of about 14%, a Te concentration of about 39%, an As concentration of about 37%, a Ge concentration of about 9%, and an In concentration of about 1%. In another example, the composition of switching material 220 may comprise a Si concentration of about 14%, a Te concentration of about 39%, an As concentration of about 37%, a Ge concentration of about 9%, and a P concentration of about 1%. In these examples, the percentages are atomic percentages which total 100% of the atoms of the constituent elements.

In another embodiment, a composition for switching material 220 may include an alloy of arsenic (As), tellurium (Te), sulfur (S), germanium (Ge), selenium (Se), and antimony (Sb) with respective atomic percentages of 10%, 21%, 2%, 15%, 50%, and 2%.

Although the scope of the present invention is not limited in this respect, in other embodiments, switching material 220 may include Si, Te, As, Ge, sulfur (S), and selenium (Se). As an example, the composition of switching material 220 may comprise a Si concentration of about 5%, a Te concentration of about 34%, an As concentration of about 28%, a Ge concentration of about 11%, a S concentration of about 21%, and a Se concentration of about 1%.

Top electrode 230 may be a thin film material having a thickness ranging from about 20 angstroms (Å) to about 2000 Å. In one embodiment, the thickness of electrode 230 may range from about 100 Å to about 1000 Å. In another embodiment, the thickness of electrode 230 may be about 300 Å. Suitable materials for top electrode 230 may include a thin film of titanium (Ti), titanium nitride (TiN), titanium tungsten (TiW), carbon (C), silicon carbide (SiC), titanium aluminum nitride (TiAlN), titanium silicon nitride (TiSiN), polycrystalline silicon, tantalum nitride (TaN), some combination of these films, or other suitable conductors or resistive conductors compatible with switching material 220.

In one embodiment, top electrode and bottom electrode may comprise carbon and may have a thickness of about 500 Å. Top electrode 230 may also be referred to as an upper electrode and bottom electrode 210 may also be referred to as a lower electrode. In this embodiment, select device 120 may be referred to as a vertical structure since electrical current may flow vertically through switching material 220 between top electrode 230 and bottom electrode 210. Select device 120 may be referred to as a thin film select device if thin films are used for switching material 220 and electrodes 210 and 230.

The threshold current ($I_{TH}$) of select device 120 may be less than the threshold current for an ovonic memory device set in a high resistance, amorphous state. The threshold voltage ($V_{TH}$) of select device 120 may be altered by changing process variables such as, for example, the thickness or alloy composition of switching material 220. For example, increasing the thickness of switching material 220 may increase the threshold voltage of select device 120. The holding voltage ($V_H$) of select device 120 may be altered or set by the type of contact to switching device 120, e.g., the composition of electrodes 210 and 230 may determine the holding voltage of select device 120.

For example, in one embodiment, if the thickness of switching material 220 composed of silicon (Si), tellurium (Te), arsenic (As), and germanium (Ge) is about 300 Å, and electrodes 210 and 230 are layers of carbon (C), then the threshold voltage of select device 120 may be about two volts and the holding voltage of select device 120 may be about one volt. Alternatively, if electrodes 210 and 230 are, layers of TiSiN with a thickness of about 300 Å, then the holding voltage of select device 120 may be about 0.8 volts. In another embodiment, if electrodes 210 and 230 are layers of TiAlN with a thickness of about 300 Å, then the holding voltage of select device 120 may be about 0.4 volts. In yet another embodiment, if electrodes 210 and 230 are layers of cobalt silicide, then the holding voltage of select device 120 may be about 0.15 volts.

Select device 120 may provide a relatively high "on current" for a given area of a device compared to other switching devices such as, for example, metal-oxide-semiconductor (MOS) transistors or bipolar junction transistors (BJTs). The relatively higher on current of select device 120 in the on state may allow for a relatively higher programming current available to select device 120 to program a memory element (e.g., 130).

The memory array shown in FIG. 1 using select device 120 illustrated in FIG. 3 may be constructed by stacking select device 120 and memory element 130 in a vertical configuration. An example of a vertical structure comprising select device 120 formed over memory element 130 is illustrated in FIG. 4.

Figure 4:
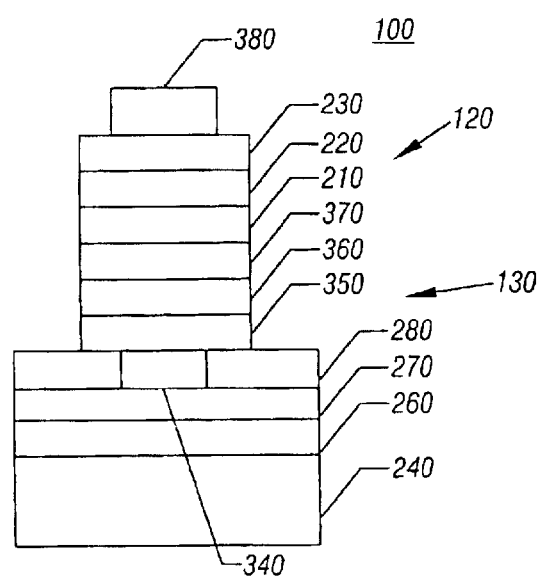
FIG. 4 is a cross-sectional view of a portion of a memory in accordance with an embodiment of the present invention.

Turning to FIG. 4, an embodiment of a portion of memory 100 is illustrated. Memory 100 may comprise a substrate 240, an insulating material 260 overlying substrate 240, and a conductive material 270 overlying insulating material 260. Conductive material 270 may be an address line (e.g., row line 152). Above conductive material 270, an opening (not shown in FIG. 4) may be formed in an insulating material 280. In the opening, a lower electrode 340 may be formed. Over electrode 340, sequential layers of a memory material 350, electrode material 360, barrier material 370, electrode 210, switching material 220, electrode 230, and a conductive material 380 may be deposited to form a vertical memory cell structure. Conductive material 380 may be an address line (e.g., column line 142).

In the embodiment illustrated in FIG. 4, memory material 350 and electrodes 340 and 360 may form memory element 130. If memory material 350 is an ovonic material or a chalcogenide material, then memory element 130 may be referred to as a phase change memory device or an ovonic memory device. Further, in the embodiment illustrated in FIG. 4, select device 120 is formed over memory element 130 to form a vertical structure or a vertical stack. In alternate embodiments, memory element 130 may be formed above select device 120 to form a vertical structure. In the embodiment illustrated in FIG. 4, select device 120 and memory element 130 are formed using only thin film materials, and the vertical stack may be referred to as a thin film vertical stack.

A thin film material may be a particular class of insulating or conducting material deposited onto a substrate or other materials and may have a specified thickness, e.g., thin film materials may refer to materials having a thickness ranging from greater than zero Å to less than about 25,000 Å. In addition, thin film materials may be materials deposited using thin film deposition techniques such as, for example, PVD (Physical Vapor Deposition), CVD (Chemical Vapor Deposition), or PECVD (Plasma Enhanced Chemical Vapor Deposition), etc.

Other embodiments may include variations in the vertical structure. For example, in one embodiment, barrier material 370 may be eliminated from the vertical structure. In another embodiment, barrier material 370 may be eliminated from the vertical structure and electrode 360 may be combined with electrode 210 into a single conductive layer to form a single electrode. Further, in another embodiment, electrode 230 may be combined with conductive material 380 to form a single conductive layer or single electrode.

Memory material 350 may be a phase change, programmable material capable of being programmed into one of at least two memory states by applying a current to memory material 350 to alter the phase of memory material 350 between a substantially crystalline state and a substantially amorphous state, wherein a resistance of memory material 350 in the substantially amorphous state is greater than the resistance of memory material 350 in the substantially crystalline state.

Programming of memory material 350 to alter the state or phase of the material may be accomplished by applying voltage potentials to conductive materials 380 and 270, thereby generating a voltage potential across select device 120 and memory element 130. When the voltage potential is greater than the threshold voltages of select device 120 and memory element 130, then an electrical current may flow through memory material 350 in response to the applied voltage potentials, and may result in heating of memory material 350.

This heating may alter the memory state or phase of memory material 350. Altering the phase or state of memory material 350 may alter the electrical characteristic of memory material 350, e.g., the resistance of the material may be altered by altering the phase of the memory material 350. Memory material 350 may also be referred to as a programmable resistive material.

In the "reset" state, memory material 350 may be in an amorphous or semi-amorphous state and in the "set" state, memory material 350 may be in an a crystalline or semi-crystalline state. The resistance of memory material 350 in the amorphous or semi-amorphous state may be greater than the resistance of memory material 350 in the crystalline or semi-crystalline state. It is to be appreciated that the association of reset and set with amorphous and crystalline states, respectively, is a convention and that at least an opposite convention may be adopted.

Using electrical current, memory material 350 may be heated to a relatively higher temperature to amorphosize memory material 350 and "reset" memory material 350 (e.g., program memory material 350 to a logic "0" value). Heating the volume of memory material 350 to a relatively lower crystallization temperature may crystallize memory material 350 and "set" memory material 350 (e.g., program memory material 350 to a logic "1" value). Various resistances of memory material 350 may be achieved to store information by varying the amount of current flow and duration through the volume of memory material 350.

Memory 100 shown in FIG. 4 may be referred to as a vertical phase change memory structure since current may flow vertically between address lines through select device 120 and memory element 130.

In other embodiments, memory 100 may be arranged differently and include additional layers and structures. For example, it may be desirable to form isolation structures, peripheral circuitry (e.g., addressing circuitry), transistors in substrate 240, etc. It should be understood that the absence of these elements in the drawings is not a limitation of the scope of the present invention.

It should be noted that the memory structure illustrated in FIG. 4 does not use transistor or diode select devices. The memory structure illustrated in FIG. 4 may be constructed as a standalone array or arrays on a substrate or may be constructed as a process module inserted into a more complex process flow that builds other structures. For example, this module may be integrated into a full complementary metal-oxide-semiconductor (CMOS) process that may also build N-channel and P-channel transistors, their wiring interconnects, and other circuit elements. In such an embodiment, the row and column lines may be respectively driven by N and P channel transistors for reading and writing in ways apparent to one reasonably skilled in the art.

Turning back to FIG. 1, an embodiment of an addressing scheme may be illustrated. For a selected memory element (e.g., 115), a "half select array biasing scheme" may be implemented, wherein a voltage of, for example, V volts, may be applied to the selected column line (e.g., 142) and approximately zero volts may be applied to the selected row line (e.g., 152).

In one embodiment, termed the "half select array biasing scheme" for the case of programming a memory element, V may be chosen to be greater than the threshold voltage of select device 120 ($V_{TH}$ SD)+the reset threshold voltage of memory element 130 ($V_{TH}$ Reset), but less than two times $V_{TH}$ SD. In other words ($V_{TH}$ SD+$V_{TH}$ Reset) <V<(2*$V_{TH}$ SD). All unselected rows and columns may be biased at V/2. In this approach, there may be no voltage bias between unselected row lines and unselected column lines. This may reduce background leakage current. After successively biasing the memory array in this way, memory elements of the array may be programmed by successively forcing a current sufficient in magnitude and with a fast falling edge of less than about 5 nano-seconds for reset and slow falling edge greater than about 200 nano-seconds for the set state to change phase of the memory material For the case of reading a memory element, V may be chosen to be greater than the threshold voltage of select device 120 ($V_{TH}$ SD), but less than the threshold voltage of select device 120 ($V_{TH}$ SD)+the reset threshold voltage of memory element 130 ($V_{TH}$ Reset). In other words ($V_{TH}$ SD)<V<($V_{TH}$ SD+$V_{TH}$ Reset). All unselected rows and unselected columns may be biased at V/2. In this approach, there may be no voltage bias between unselected row lines and unselected column lines. This may reduce background leakage current. After biasing the memory array in this way, memory elements of the array may be successively read by successively forcing a relatively lower current or voltage than that required to write or disturb a bit, to determine resistance of the memory material of the memory elements. A forced voltage is less than the voltage that will exceed the threshold of the memory element yet great enough to result in detectably more current through a set bit than a reset bit. Alternately, a current less than $I_{TH}$ of the memory element may be forced through a bit. This current may cause a detectably smaller voltage drop across a set memory element than a reset memory element. For example, the reset current may be about 1.5 miliamps (ma) and $I_{TH}$ may be greater than about 0.03 ma. Iread may be about 0.01 ma for a process with Rset less than about 10,000 ohms, so that the maximum drop across a set memory element may be under about 0.1 volts and $I_{TH}$ of the memory element is not exceeded. For a memory device with $V_{TH}$ of about 0.8 volts, the reset device may clamp the voltage across the memory device at about 0.6 volts without thresholding or snapping back. This will provide a read voltage difference between the set and reset state of about 0.6 volts minus about 0.1 or 0.5 volts, that may accommodate the variation in the hold voltages of the device switch and memory element.

Another embodiment of an addressing scheme may be termed the "one-third select array biasing scheme." This embodiment may improve deselect margin. In this embodiment, for the case of programming a memory element, a voltage of V volts may be applied to a selected column line and zero volts may be applied to the selected row line. V may be chosen to be greater than the threshold voltage of select device 120 ($V_{TH}$ SD)+the reset threshold voltage of memory element 130 ($V_{TH}$ Reset), but less than three times $V_{TH}$ SD. In other words ($V_{TH}$ SD+$V_{TH}$ Reset) <V<(3*$V_{TH}$ SD). All unselected rows may be biased at (2V)/3. All unselected columns may be biased at V/3. In this approach, there may be a voltage bias between unselected row lines and unselected column lines of approximately +/-V/3. This may provide additional manufacturing margin for variability of threshold voltages of select device 120 and memory element 130. After biasing the memory array in this manner, memory elements of the array may be programmed by forcing a current sufficient to change the phase of a memory material.

For the case of reading a memory element, a voltage of V may be chosen to be greater than the threshold voltage of select device 120 ($V_{TH}$ SD), but less than the threshold voltage of select device 120 ($V_{TH}$ SD)+the reset threshold voltage of memory element 130 ($V_{TH}$ Reset). In other words ($V_{TH}$ SD)<V<($V_{TH}$ SD+$V_{TH}$ Reset). All unselected rows may be biased at (2V)/3. All unselected columns may be biased at V/3. In this approach, there may be a voltage bias between unselected row lines and unselected column lines of approximately +/-V/3. This may provide additional manufacturing margin for variability of threshold voltage of select device 120. After biasing the memory array in this manner, memory elements of the array may be read by forcing a relatively lower current to determine resistance of the memory material of the memory elements such as by the methods used in the V/2 approach discussed above in the half select approach.

Programming a selected memory cell may include biasing unselected row and unselected column lines as discussed above in the "half select array biasing scheme" and "one-third select array biasing scheme" embodiments. On the selected column line, a current may be forced with a compliance that may be greater than the threshold voltage of selected device 120 and the threshold voltage of memory element 130. The current amplitude, duration, and pulse shape may be selected to place the memory element in the desired phase or memory state.

Reading a selected memory cell of the array may include biasing unselected row and column lines as discussed above in the "half select array biasing scheme" and "one-third select array biasing scheme" embodiments. Combinations of these schemes for conventional use that reflect margin needs, array sizes, and leakage requirements in the product may allow one reasonably skilled in the art to determine the appropriate bias voltages that will meet product specifications which may vary by application. Zero volts may be applied to the selected row line and a voltage V applied on the selected column line. The current compliance of this forced voltage may be less than the current that may program or disturb the present phase or memory state of the memory element. If the memory element is in a "reset" state, the memory element may not switch "on" and may present a relatively large voltage, low current condition to a sense amplifier (not shown). The sense amplifier may either compare the resulting column voltage to a reference voltage or compare the resulting column current to a reference current.

FIGS. 5–12 may be used to illustrate an embodiment to fabricate or manufacture a portion of memory 100. In particular, FIGS. 5–12 may be used to illustrate an embodiment to fabricate select device 120 and memory element 130.

Figure 5:
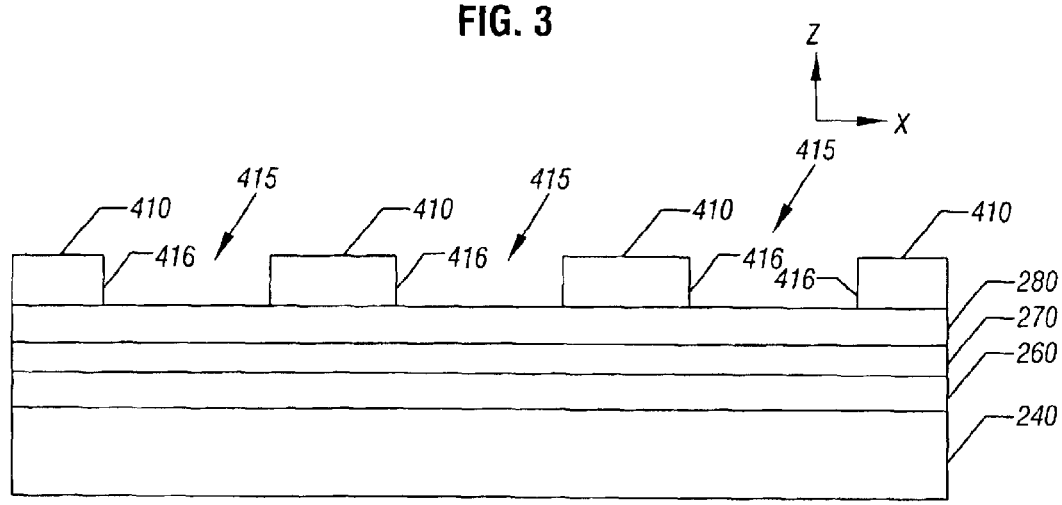
FIG. 5 is a cross-sectional view of a portion of the memory of FIG. 1 during fabrication in accordance with an embodiment of the present invention.

Turning to FIG. 5, memory 100 may comprise a substrate 240 that may be, for example, a semiconductor substrate (e.g., a silicon substrate), although the scope of the present invention is not limited in this respect. Other suitable substrates may be, but are not limited to, substrates that contain ceramic material, organic material, or a glass material.

A layer of insulating material 260 may be formed over and contacting substrate 240. Insulating material 260 may be a dielectric material that may be a thermally and/or electrically insulating material such as, for example, silicon dioxide, although the scope of the present invention is not limited in this respect. Insulating material 260 may have a thickness ranging from about 300 Å to about 10,000 Å, although the scope of the present invention is not limited in this respect. Insulating material 260 may be planarized using a chemical or chemical-mechanical polish (CMP) technique.

A thin film of a conductive material 270 may be formed overlying insulating material 270 using, for example, a PVD process. Conductive material 270 may be patterned using photolithographic and etch techniques to form a small width in the y-direction (orthogonal to the view shown in FIG. 5). The film thickness of conductive material 270 may range from about 20 Å to about 2000 Å. In one embodiment, the thickness of conductive material 270 may range from about 200 Å to about 1000 Å. In another embodiment, the thickness of conductive material 270 may be about 500 Å.

Conductive material 270 may be an address line of memory 100 (e.g., row line 151, 152, or 153). Conductive material 270 may be, for example, a tungsten (W) film, a doped polycrystalline silicon film, a Ti film, a TiN film, a TiW film, an aluminum (Al) film, a copper (Cu) film, or some combination of these films. In one embodiment, conductive material 270 may be a polycrystalline silicon film with a resistance lowering strap of a refractory silicide on its top surface, similar to a poly gate used in CMOS over a thick filed oxide, although the scope of the present invention is not limited in this respect.

An insulating material 280 may be formed overlying conductive material 270 using, for example, a PECVD (Plasma Enhanced Chemical Vapor Deposition) process, HDP (High Density Plasma) process, or spin-on and bake SOLGEL process. Insulating material 280 may be a dielectric material that may be a thermally and/or electrically insulating material such as, for example, silicon dioxide, although the scope of the present invention is not limited in this respect. Insulating material 280 may have a thickness ranging from about 100 Å to about 4000 Å, although the scope of the present invention is not limited in this respect. In one embodiment, the thickness of insulating material 280 may range from about 500 Å to about 2500 Å. In another embodiment, the thickness of insulating material 280 may be about 1200 Å.

Although the scope of the present invention is limited in this respect, insulating material 280 may be planarized using a chemical or CMP technique. The resulting thickness of insulating material 280 may range from about 20 Å to about 4000 Å. In one embodiment, after planarizing insulating material 280, the thickness of insulating material 280 may range from about 200 Å to about 2000 Å. In another embodiment, the thickness of insulating material 280 may be about 900 Å.

A sacrificial film 410 may be deposited overlying insulating material 280. Sacrificial film 410 may be, for example, a silicon nitride (SiN) film or a polycrystalline silicon film. The thickness of sacrificial film 410 may range from about 20 Å to about 4000 Å. In one embodiment, the thickness of sacrificial film 410 may range from about 200 Å to about 2000 Å. In another embodiment, the thickness of sacrificial film 410 may be about 1000 Å.

Sacrificial film 410 may be patterned using photolithographic and etch techniques to form openings 415 having sidewalls 416. Openings 415 may be holes, vias or trenches, although the scope of the present invention is not limited in this respect.

In one embodiment, openings 415 may be formed using photolithographic and etch techniques. As an example, openings 415 may be formed by applying a layer of photoresist material (not shown) on sacrificial film 410 and exposing this photoresist material to light. A mask (not shown) may be used to expose selected areas of the photoresist material, which defines areas to be removed, i.e., etched. The etch may be a chemical etch, which may be referred to as a wet etch. Or, the etch may be a plasma (ion bombardment) etch, which may be referred to as a dry etch. If openings 415 are formed using photolithographic techniques, the diameter or width of openings 415 may be at least one minimum feature size.

The minimum feature size of a structure may refer to the minimum dimension achievable using photolithography. For example, the minimum feature size may refer to a width of a material or spacing of materials in a structure. As is understood, photolithography refers to a process of transferring a pattern or image from one medium to another, e.g., as from a mask to a wafer, using a certain wavelength or wavelengths of light. The minimum feature size of the transferred pattern that is available in state of the art IC manufacturing may be limited by the limitations of the wavelength of the light source. Distances, sizes, or dimensions less than the minimum feature size may be referred to as sub-lithographic distances, sizes, or dimensions. For example, some photolithographic processes may have minimum feature sizes of about 2500 angstroms. In this example, a sub-lithographic distance may refer to a feature having a width of less than about 2500 angstroms.

Figure 6:
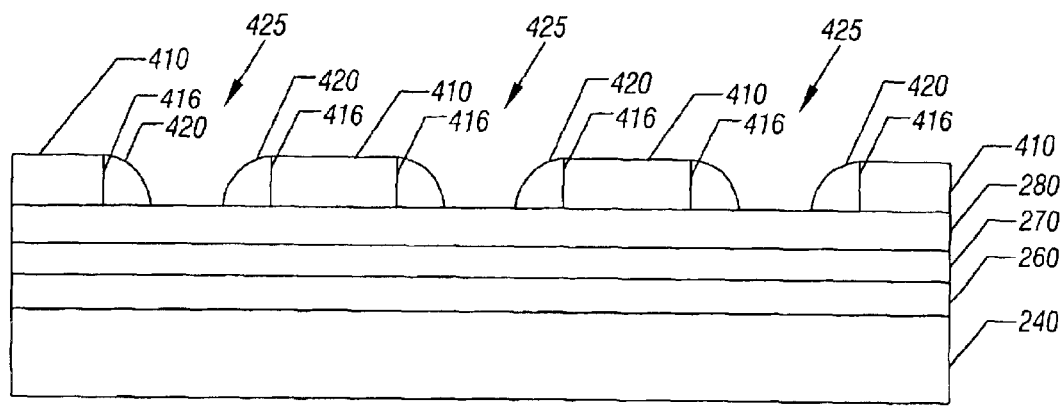
FIG. 6 is a cross-sectional view of the structure of FIG. 5 at a later stage of fabrication.

Several techniques may be used to achieve sub-lithographic dimensions. Although the scope of the present invention is not limited in this respect, phase shift mask, electron beam lithography, or x-ray lithography may be used to achieve sub-lithographic dimensions. Electron beam lithography may refer to a direct-write lithography technique using a beam of electrons to expose resist on a wafer. X-ray lithography may refer to an advanced lithographic process for transferring patterns to a silicon wafer in which the electromagnetic radiation used is X-ray, rather than longer wavelength radiation. The shorter wavelength for X-rays (e.g., about 10–200 angstroms, versus about 2000–3000 angstroms for ultra-violet radiation) may reduce diffraction, and may be used to achieve feature sizes of about 1000 angstroms and less. Also, sidewall spacers may be used to achieve sub-lithographic dimensions. FIG. 6 may be used to illustrate the use of sidewall spacers 420 to achieve sub-lithographic dimensions.

FIG. 6 depicts the structure of FIG. 5, through the same cross-sectional view, after forming sidewall spacers 420. In one embodiment, sidewall spacers 420 may be formed along sidewalls 416 of a sacrificial film 410. The distance between sidewalls 416 may be one feature size and may be formed using photolithographic and etch techniques. Sidewall spacers 420 may be formed by depositing a layer of silicon nitride, poly silicon, or another sacrificial material in the space between sidewalls 416 and patterning this material using a dry etch such as, for example, an anisotropic etch.

The distance between sidewall spacers 420 may be sub-lithographic. After sidewall spacers 420 are formed, in one embodiment, another anisotropic etch may be used to form an opening 430 (FIG. 7) in thin film 280 having a sub-lithographic diameter.

Figure 7:
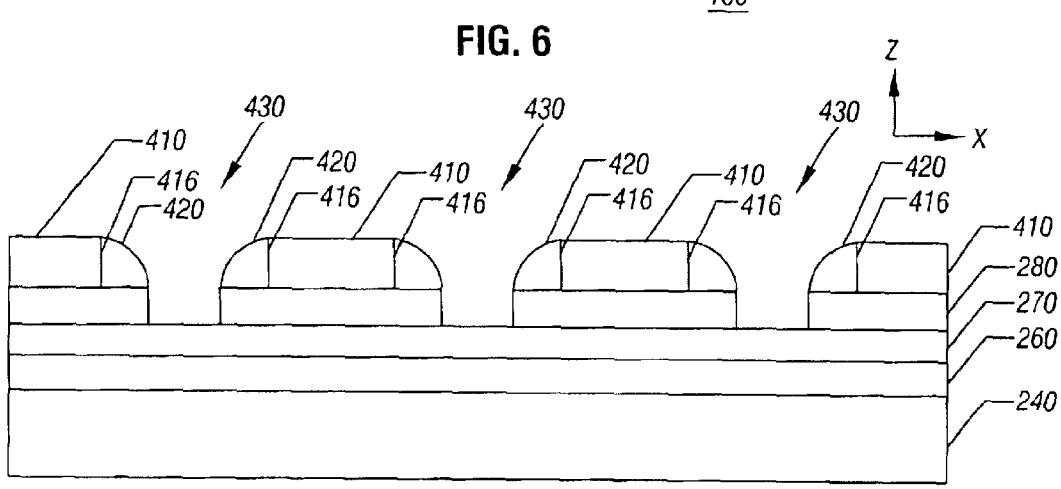
FIG. 7 is a cross-sectional view of the structure of FIG. 6 at a later stage of fabrication.

Turning to FIG. 7, in one embodiment, sacrificial film 410 and spacers 420 may be used as a hard mask and insulating material 280 may be anisotropically etched using an etching agent that is selective such that the etching agent stops at, or preserves, conductive material 270.

As shown in FIG. 7, the etching operation exposes a portion of conductive material 270 through opening 430. In one aspect, sidewall spacers 420 may serve to reduce the quantity of electrode material (e.g., 340 shown in FIG. 8) formed in opening 430. In one embodiment, the diameter of opening 430 may be less than about 1000 angstroms, although the scope of the present invention is not limited in this respect.

It should be pointed out that the use of sidewall spacers 420 to form opening 430 is not a limitation of the present invention. Other sub-lithographic methods, as mentioned above, may be used to form opening 430, wherein opening 430 may have a sub-lithographic diameter. Or, in alternate embodiments, opening 430 may be formed using photolithographic techniques and may therefore, have a diameter of greater than or equal to about one minimum feature size.

Sacrificial film 410 and spacers 420 may be removed after forming opening 430. For example, sacrificial film 410 and spacers 420 may be selectively etched while preserving insulating material 280 and conductive material 270.

Figure 8:
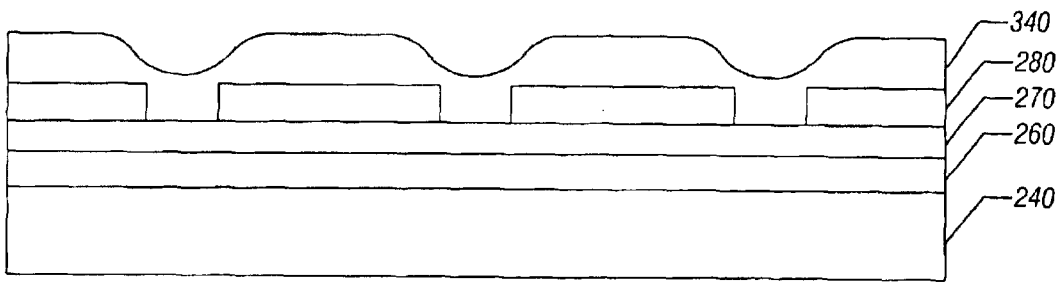
FIG. 8 is a cross-sectional view of the structure of FIG. 7 at a later stage of fabrication.

FIG. 8 illustrates memory 100 after the conformal deposition of an electrode material 340 over insulating material 280 and in opening 430 (FIG. 7). Electrode material 340 may be a layer of C, SiC, TiSIN, TIAIN, polycrystalline silicon, TaN, some combination of these, or other suitable resistive conductors. As an example, electrode material 340 may be formed using a chemical vapor deposition (CVD) process, however, the scope of the present invention is not limited by the particular process used to form electrode material 340. It should also be understood that alternative processes may be used to form electrode material 340. As an example, ALD (Atomic Layer Deposition) may be used.

Figure 9:
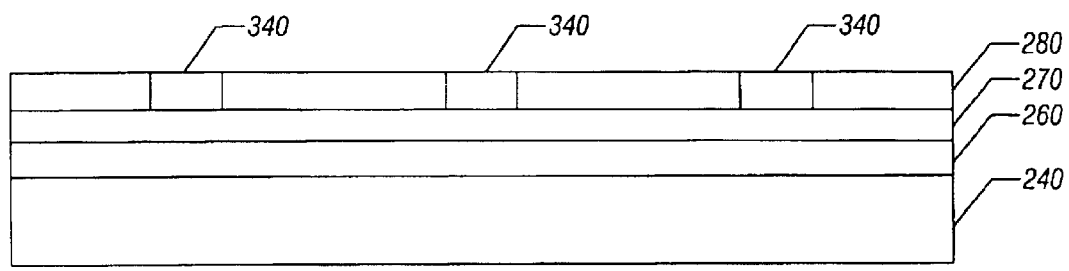
FIG. 9 is a cross-sectional view of the structure of FIG. 8 at a later stage of fabrication.

Following introduction of electrode material 340, the structure shown in FIG. 8 may be subjected to a planarization that removes a portion of electrode material 340 and may remove a portion of insulating layer 280. Suitable planarization techniques may include a chemical or CMP technique. Other techniques may also be used to pattern materials 340 and 280. For example, a blanket etch may be used to remove portions of insulating layer 280 and electrode material 340. FIG. 9 illustrates the structure shown in FIG. 8 after patterning of electrode material 340.

Figure 10:
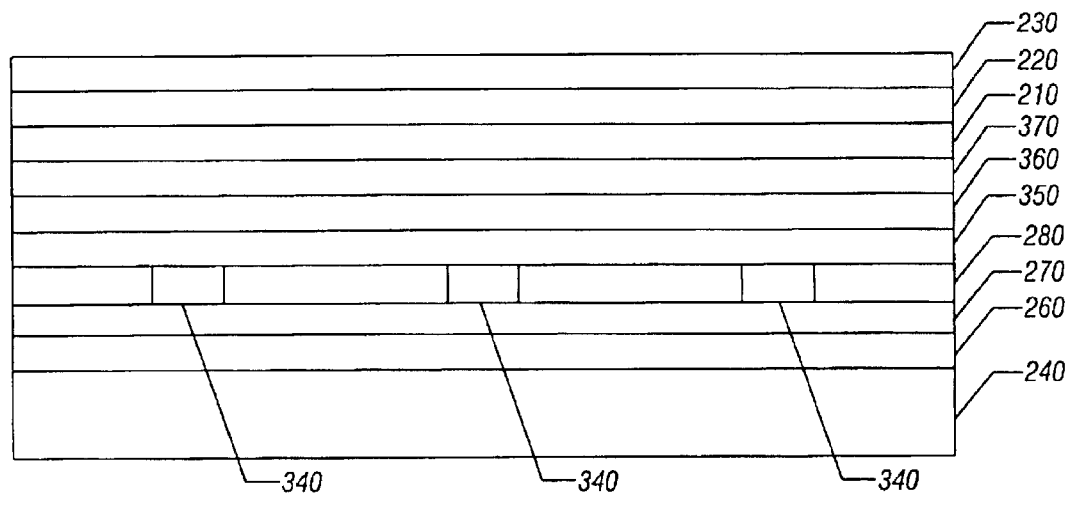
FIG. 10 is a cross-sectional view of the structure of FIG. 9 at a later stage of fabrication.

FIG. 10 illustrates the structure of FIG. 9 at a later stage of fabrication. A thin film of memory material 350 may be deposited overlying insulating material 280 and electrodes 340.

Memory material 350 may be formed using, for example, a PVD process. Memory material 350 may be a programmable material such as, for example, a phase change material. Memory material 350 may be an ovonic material or a chalcogenide material. The thickness of memory material 350 may range from about 20 Å to about 4000 Å. In one embodiment, the thickness of memory material 350 may range from about 200 Å to about 1000 Å. In another embodiment, the thickness of memory material 350 may be about 500 Å.

Electrode material 360 may be deposited overlying memory material 350. Electrode material 360 may be formed using, for example, a PVD process. Electrode material 360 may be Ti, TiN, TiW, C, SiC, TIAIN, TiSiN, polycrystalline silicon, TaN, some combination of these, or other suitable conductors or resistive conductors. The thickness of electrode material 360 may range from about 20 Å to about 2000 Å. In one embodiment, the thickness of electrode material 360 may range from about 100 Å to about 1000 Å. In another embodiment, the thickness of electrode material 360 may be about 300 Å.

Barrier material 370 may be deposited overlying electrode material 360. Barrier material 370 may be formed using, for example, a PVD process. Barrier material 370 may be Ti, TiN, TiW, C, SiC, TIAIN, TiSiN, polycrystalline silicon, TaN, some combination of these, or other suitable conductors or resistive conductors that provide a barrier between electrode materials 360 and 210. In one embodiment, barrier material may be composed of TiN and Ti films. The thickness of barrier material 370 may range from about 20 Å to about 2000 Å. In one embodiment, the thickness of barrier material 370 may range from about 100 Å to about 1000 Å. In another embodiment, the thickness of barrier material 370 may be about 300 Å.

Electrode 210 may be deposited overlying barrier material 370 using, for example, a PVD process. Switching material 220 may be deposited overlying electrode 210 using, for example, a PVD process and electrode 230 may be deposited overlying switching material 220 using, for example, a PVD process. Examples of compositions and thicknesses of electrode 210, switching material 220, and electrode 230 are discussed above with reference to FIG. 3.

In one embodiment, thin film layers 350, 360, 370, 210, 220, and 230 or a subset thereof, may be deposited by means of a PVD process, in-situ. That is, all layers may be deposited sequentially in a sputter deposition tool without venting back to atmospheric pressure or exposure to atmospheric gases between each thin film layer deposition.

Figure 11:
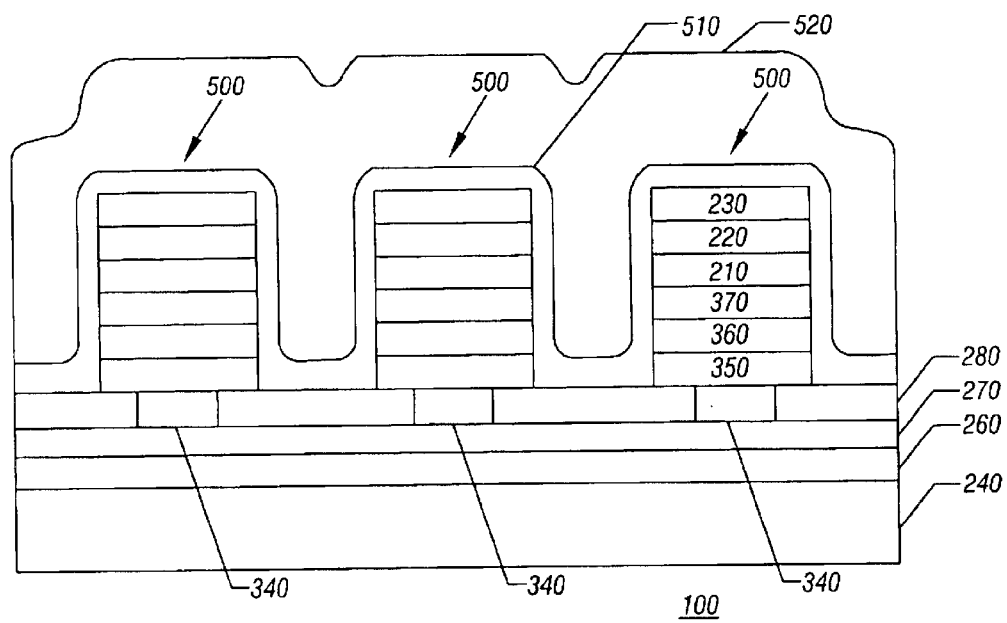
FIG. 11 is a cross-sectional view of the structure of FIG. 10 at a later stage of fabrication.

FIG. 11 illustrates the structure shown in FIG. 10 after patterning of materials 230, 220, 210, 370, 360, and 350 using, for example, photolithographic and etch techniques, to form three cylindrical or box structures 500. Cylinder shaped structures may be achieved using a single photo/single etch process. Box shaped structures may be achieved using a dual photo/single etch process. In alternate embodiments, box shaped structures may be achieved using a single photo/single etch/single photo/single etch process. Although three cylindrical or box structures are illustrated, this is not a limitation in the present invention. For example, in other embodiments, more than three cylinder or box shaped structures may be formed.

In addition, FIG. 11 illustrates memory 100 after the conformal deposition of an insulating material 510 on a portion of a top surface of insulating material 280, and along the sidewalls and top surface of structures 500. Insulating material 510 may be a silicon dioxide or silicon nitride material. Insulating material 510 may have a thickness ranging from about 20 Å to about 10,000 Å. In one embodiment, the thickness of insulating material 510 may range from about 100 Å to about 1000 Å. In another embodiment, the thickness of insulating material 510 may be about 250 Å. Insulating material 510 may be deposited at a relative cooler temperature, e.g., in the range of 200–600 degrees Celsius, and in one embodiment, at a temperature of about 250 degrees Celsius.

An interlayer insulator 520 may be deposited overlying insulating material 510. Interlayer insulator 520 may be, for example, a silicon dioxide deposited using a high density plasma (HDP) process. Interlayer insulator 520 may have a thickness ranging from about 300 Å to about 20,000 Å. In one embodiment, the thickness of interlayer insulator 520 may range from about 2000 Å to about 10,000 Å. In another embodiment, the thickness of interlayer insulator 520 may be about 6000 Å.

Figure 12:
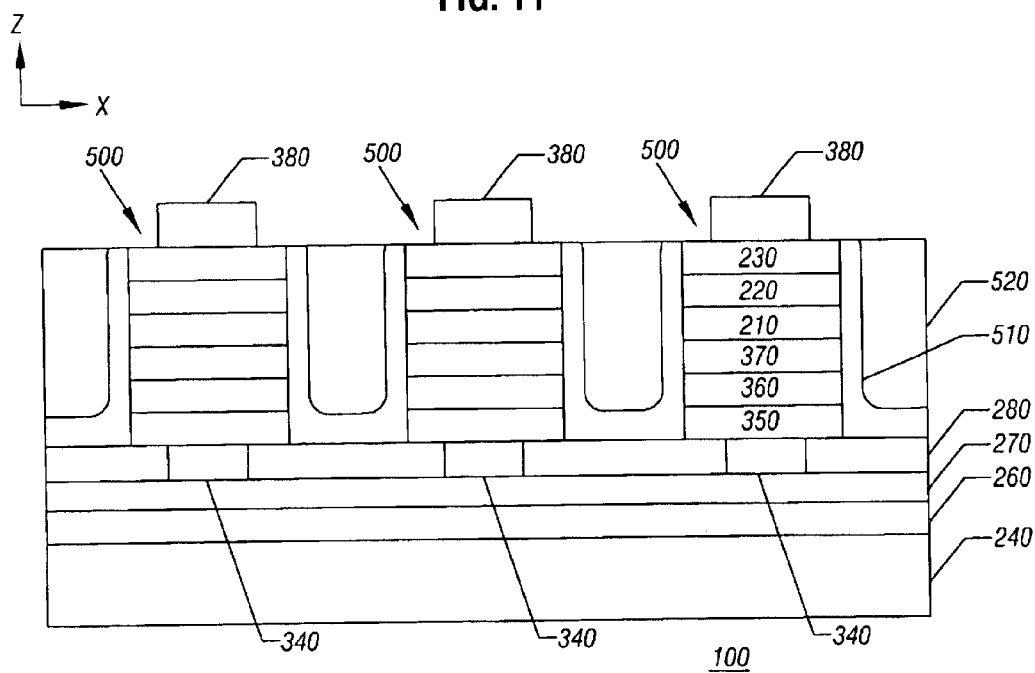
FIG. 12 is a cross-sectional view of the structure of FIG. 11 at a later stage of fabrication.

FIG. 12 illustrates the structure shown in FIG. 11 after planarization of materials 510, 520, and possibly 230 using, for example, a CMP process. Conductive materials 380 may be formed over and contacting electrodes 230 by, for example, depositing a layer of aluminum and patterning this layer using photolithographic and etch techniques to form parallel strips that extend in the y-direction (orthogonal to the x-direction shown in FIG. 12). Conductive materials 380 may be address lines such as, for example, column lines 141–143 schematically illustrated in FIG. 1. As may be appreciated, column lines 141–143 may be orthogonal to row lines 151–153.

Other suitable materials for conductive layer 380 may include a tungsten (W) film, a doped polycrystalline silicon film, a Ti film, a TiN film, a TiW film, a copper film, or some combination of these films. In one embodiment, conductive material 380 may be a polycrystalline silicon film with a resistance lowering strap of a cobalt silicide ($CoSi_2$) on its top surface. Conductive material 380 may have a thickness ranging from about 100 Å to about 20,000 Å. In one embodiment, the thickness of conductive material 380 may range from about 300 Å to about 5000 Å. In another embodiment, the thickness of conductive material 380 may be about 2000 Å.

In the embodiment illustrated in FIG. 12, memory material 350 and electrodes 340 and 360 may form memory element 130 (FIG. 1). Switching material 220 and electrodes 210 and 230 may form select device 120 (FIG. 1).

Figure 13:
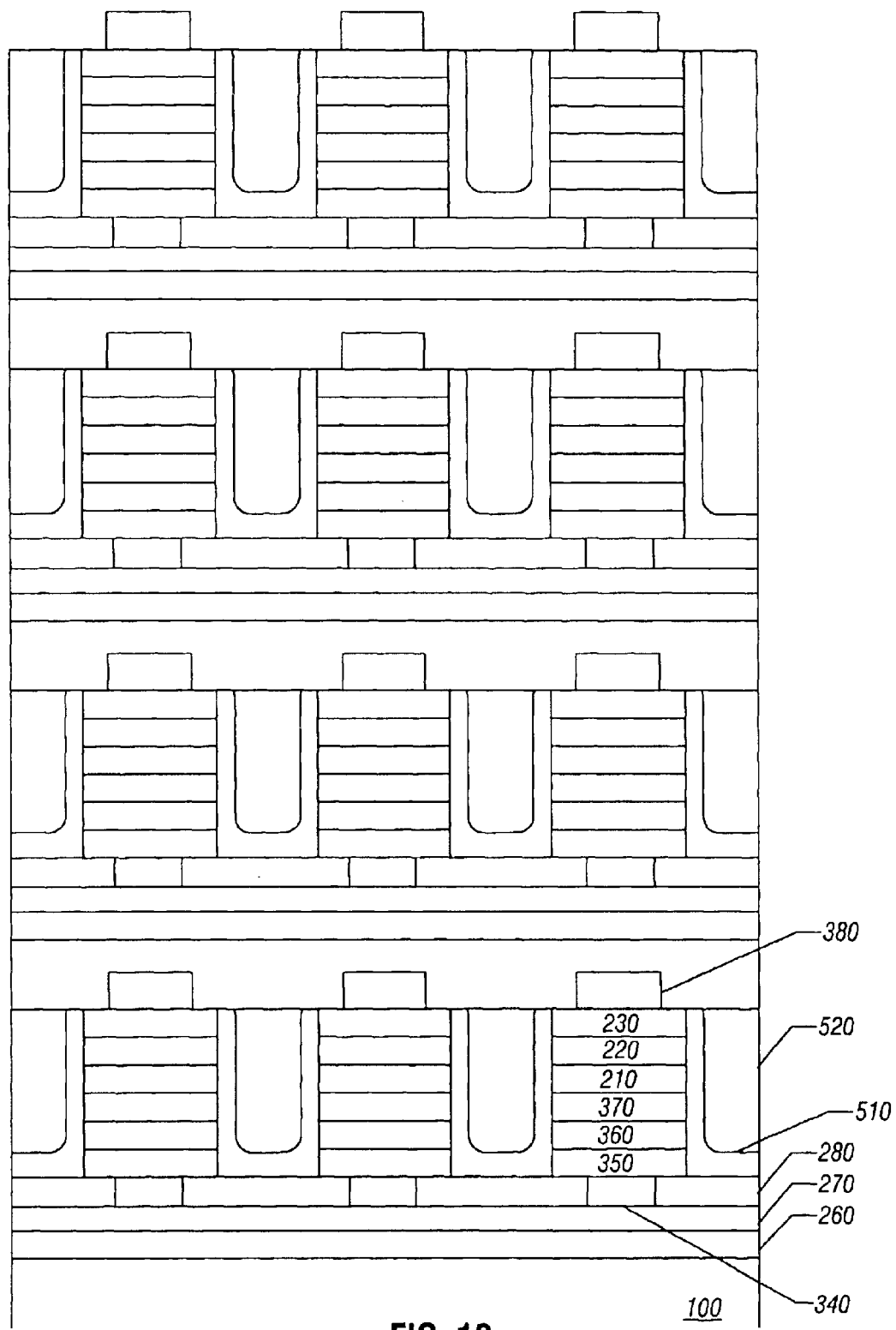
FIG. 13 is a cross-sectional view illustrating a memory array in accordance with an embodiment of the present invention.

Memory arrays using the structure illustrated in FIG. 12 may be manufactured using thin films for the memory elements and select devices. In this type of an array, single crystal silicon devices such as MOS transistors or BJTs are not used in the memory array. Thus, it may be possible to vertically stack memory arrays on top of one another which may increase memory density with a relatively small increase in wafer processing costs. FIG. 13 illustrates an example of a four layer stack of memory arrays in accordance with an embodiment of the present invention.

Although not shown in FIG. 13, on-chip transistors, peripheral circuitry, and/or address circuitry may be positioned under the memory array. This may reduce chip die area. Memory array efficiency may be defined as the percentage of the total product chip area that is made up of memory cells compared to the amount of chip area that is used for other circuitry. In one embodiment, memory efficiency of 90% or higher may be achieved by using the thin film memory structures as discussed above along with placing on-chip transistors, peripheral circuitry, and/or address circuitry underneath the memory array. Alternately, SRAM may be placed under the memory array in available places to increase the bandwidth of writing to the chip for later data placement in the non-volatile memory portion of the chip.

Figure 14:
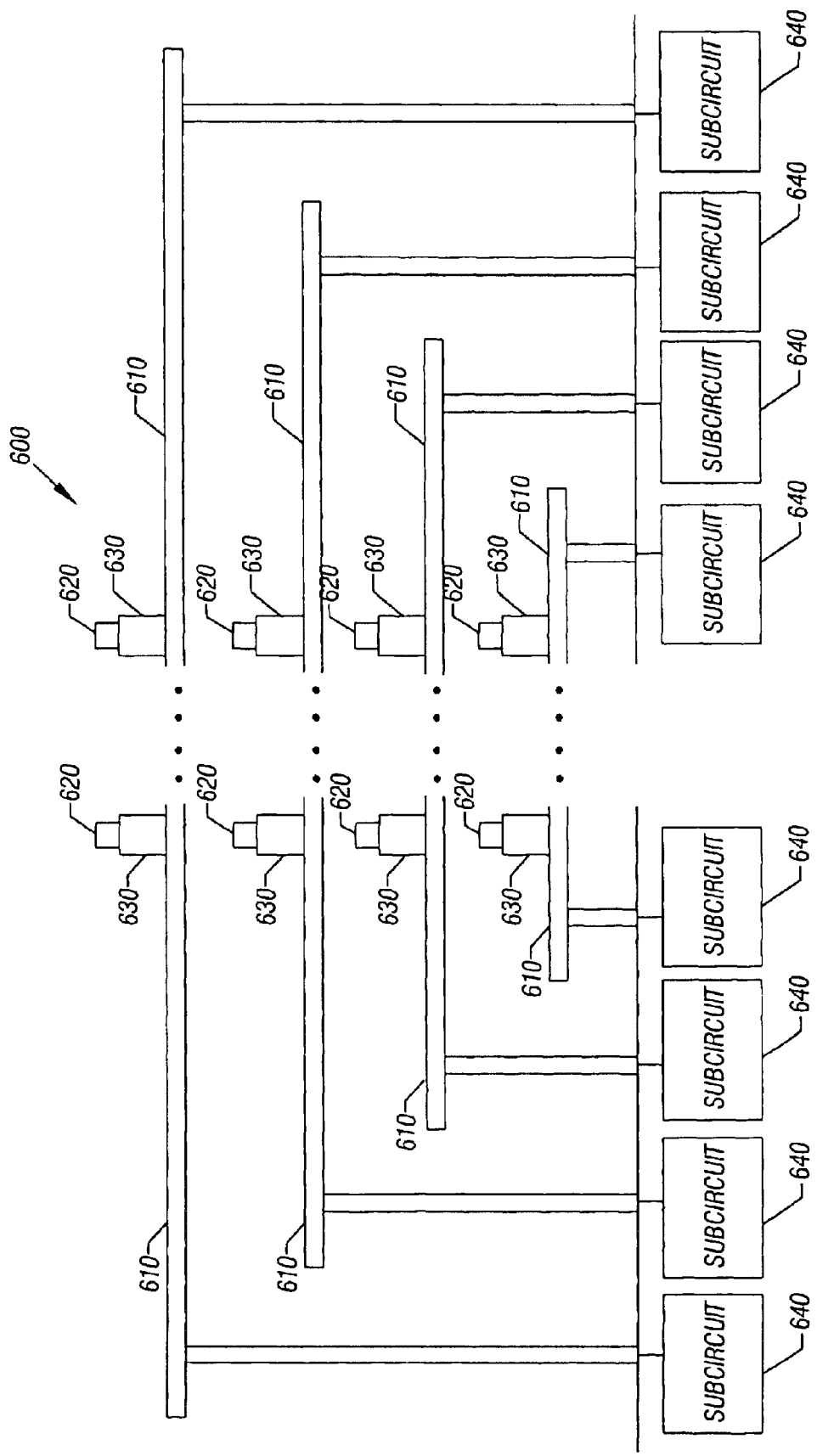
FIG. 14 is a schematic diagram illustrating a memory in accordance with an embodiment of the present invention.

Stacked multi-layer arrays may gain access to on chip CMOS transistor pitched array support subcircuits such as, for example, row drivers, column drivers, and sense-amps, as schematically illustrated in FIG. 14. Turning to FIG. 14, a memory 600 is illustrated.

Memory 600 may include memory cells 630 coupled between row lines 610 and column lines 620 which may run orthogonal to row lines 610. Memory cells 630 may include a vertically stacked, thin film select device and a memory element such as a phase change memory element as discussed herein. In other words, memory cells 630 may include a vertical structure that includes a select device and a memory element such as a phase change memory element that are formed using thin film materials.

Support subcircuits 640 may be under memory cells 630 and may be coupled to row lines 610 and column lines 620. These subcircuits may comprise drive and sense transistors for the array, and also other support circuits helpful for efficient use of the memory in a system such as, for example, cache SRAM memory. Placing support subcircuits 640 under the memory array in this manner may increase memory efficiency and may economically allow fewer bits per row line and per column line. This may have the advantage of increasing speed for read and write operations due to reduced parasitic resistance and capacitance and may also provide for more efficient redundancy schemes.

Figure 15:
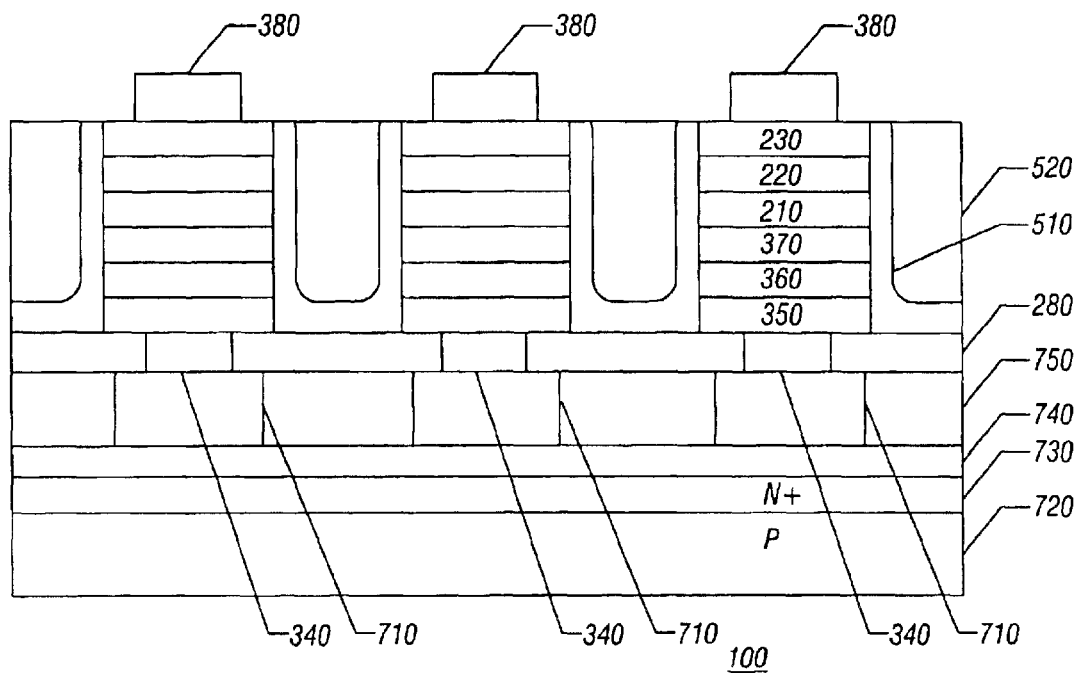
FIG. 15 is a cross-sectional view illustrating a portion of a memory in accordance with another embodiment of the present invention.

FIG. 15 illustrates another embodiment of memory 100. In this embodiment, a row line is formed using a salicided single crystal active region of N+ or P+. For example, a row line may be formed using a P region 720, an N+ region 730, and a refractory salicide strap 740 of, for example, $CoSi_2$, $TiSi_2$, or $NiSi_2$. This row line may be coupled to electrodes 340 via conductive plugs 710. Conductive plugs 710 may be surrounded by an insulating material 750, such as, for example, a silicon dioxide. Conductive plugs 710 may be, for example, tungsten, and may include a liner (not shown) of, for example, Ti and/or TiN. In an alternate embodiment, not shown, conductive material 380 may be coupled to electrode 230 via a conductive plug.

Figure 16:
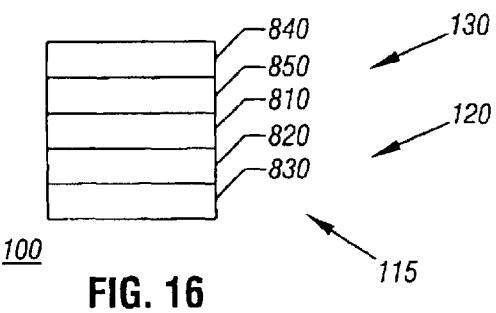
FIG. 16 is a cross-sectional view illustrating a memory cell in accordance with an embodiment of the present invention.

FIG. 16 illustrates an alternate embodiment of a memory cell (e.g., 115) of memory 100. Although the scope of the present invention is not limited in this respect, in this embodiment, memory cell 115 may include an electrode 830, a switching material 820 overlying electrode 830, and an electrode 810 overlying switching material 820 to conduct current between the switching material 820 and memory material 850. In addition, memory cell 115 may include a memory material 850 overlying electrode 810. In other words, electrode 810 may be under and contacting memory material 850. Further, memory cell 115 may include an electrode 840 overlying memory material 850.

Memory cell 115 is a vertical structure that may be formed of thin film materials and may be formed over a substrate (not shown). Select device 120 may include switching material 820 along with it's upper and lower electrodes 810 and 830 respectively, and memory element 130 may include memory material 850 along with it's upper and lower electrodes 840 and 810, respectively.

Switching material 820 may be formed using the same or similar materials, and using the same or similar techniques as described herein for switching material 220. Further, memory material 850 may be formed of the same or similar materials, and using the same or similar techniques as described herein for memory material 350.

Electrodes 830 and 840 may serve as address lines (e.g., column or row lines). Electrodes 830, 810, and 840 may be composed of materials similar to, or the same as the examples discussed herein for materials 380, 370, 230, 210, 360, and 340. In one embodiment, electrodes 830, 810, and 840 may be a layer of carbon, although the scope of the present invention is not limited in this respect. In addition, the thickness of, and the techniques used to form materials 380, 370, 230, 210, 360, and 340 may be used to form electrodes 830, 810, and 840.

Figure 17:
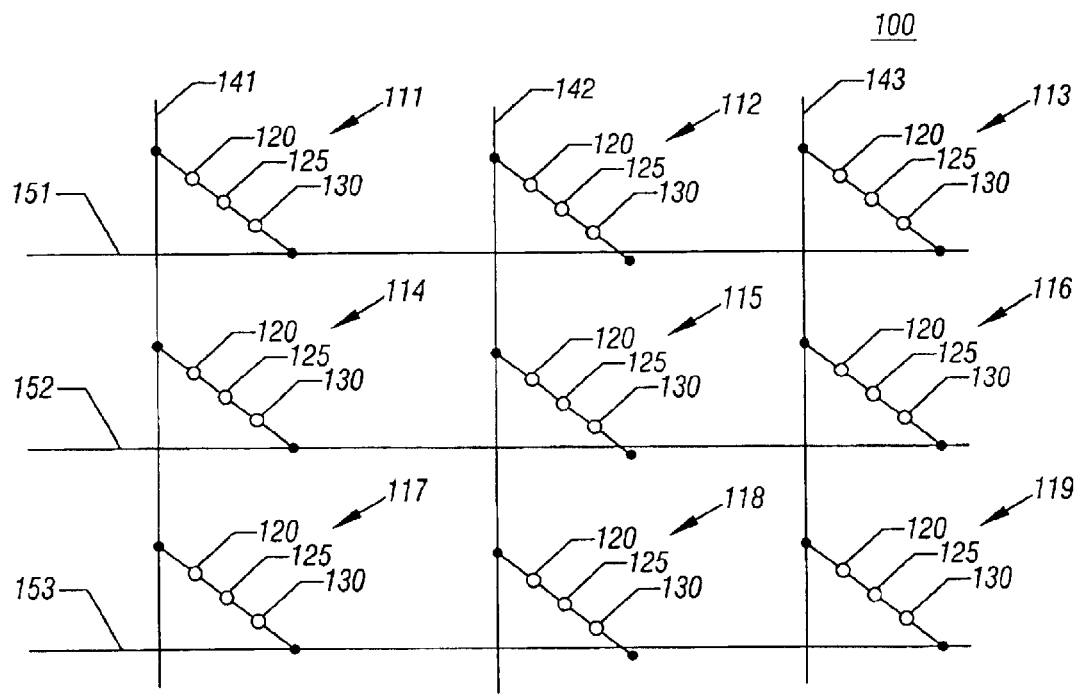
FIG. 17 is a schematic diagram illustrating a memory in accordance with another embodiment of the present invention.

FIG. 17 is a schematic diagram illustrating another embodiment of memory 100. In this embodiment, memory cells 111–119 each include select device 120, a select device 125, and memory element 130. In this embodiment, the total snapback may be reduced to allow use of a lower threshold memory element. For example, if the total $V_{TH}$ for the pair of ovonic switches is about two volts, the individual $V_{TH}$ of each switch may be about one volt by appropriate choice of the switching material thickness. If the $V_H$ of each is, for example, 0.8 volts, the snapback may be reduced to about 0.4 volts total from about 1.2 volts if a single device is used. Such a stacked series set of switch devices may reduce the tendency to disturb a bit during read. Such a stack may be comprised of one switch, two switches, or more switches in series with the memory element, all placed between the row and column line assisting reliable memory selection and operation.

As is illustrated, memory element 130 and select devices 120 and 125 are connected in a serial arrangement. In one embodiment, select devices 120 and 125 may be ovonic switches and memory element 130 may be an ovonic memory.

Figure 18:
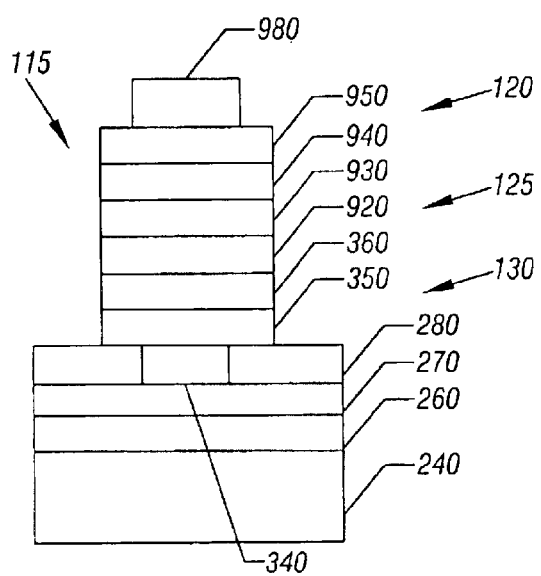
FIG. 18 is a cross-sectional view of a portion of the memory illustrated in FIG. 17 in accordance with an embodiment of the present invention.

Turning to FIG. 18, an embodiment of a memory cell (e.g., 115) of memory 100 is illustrated in accordance with another embodiment of the present invention. Memory cell 115 may comprise substrate 240, insulating material 260 overlying substrate 240, and conductive material 270 overlying insulating material 260. Conductive material 270 may be an address line (e.g., row line 152). Above conductive material 270, electrode 340 may be formed between portions of insulating material 280. Over electrode 340, sequential layers of a memory material 350, electrode material 360, a switching material 920, an electrode material 930, a switching material 940, an electrode material 950, and a conductive material 980 may be deposited to form a vertical memory cell structure. Conductive material 980 may be an address line (e.g., column line 142).

The embodiment of memory cell 115 illustrated in FIG. 18 may be formed using similar materials and manufacturing techniques as discussed with reference to FIGS. 5–12 and 15. In the embodiment illustrated in FIG. 18, select devices 125 and 120 are formed over memory element 130 to form a serially coupled, thin film vertical structure or vertical stack. In alternate embodiments, memory element 130 may be formed above select devices 120 and 125 or memory element 130 may be formed between select devices 120 and 125 to form a serially coupled, thin film vertical structure. In the embodiment illustrated in FIG. 18, select devices 120 and 125 and memory element 130 may be formed using thin film materials, and the vertical stack may be referred to as a thin film vertical stack.

In the embodiment illustrated in FIG. 18, memory material 350 and electrodes 340 and 360 may form memory element 130. Memory material 350 may be an ovonic material or a chalcogenide material and may be referred to as an ovonic memory. Switching material 920 and electrodes 360 and 930 may form select device 125. Switching material 920 may be formed using similar materials and similar manufacturing techniques used to form switching material 220 described herein. Switching material 940 and electrodes 930 and 950 may form select device 120. Switching material 940 may be formed using similar materials and similar manufacturing techniques used to form switching material 220 described herein. In alternate embodiments, switching materials 920 and 940 may be composed of the same material or different materials. For example, in one embodiment, switching material 920 may be composed of a chalcogenide material and switching material 940 may be composed of another different chalcogenide material.

In one embodiment, select devices 120 and 125 may be ovonic switches and memory element 130 may be an ovonic memory and memory cell 115 may be referred to as an ovonic memory cell. As discussed above, an example of an I-V characteristic for select device 120 is shown in FIG. 2. Select device 125 may have an I-V characteristic similar to that illustrated in FIG. 2.

Figure 19:
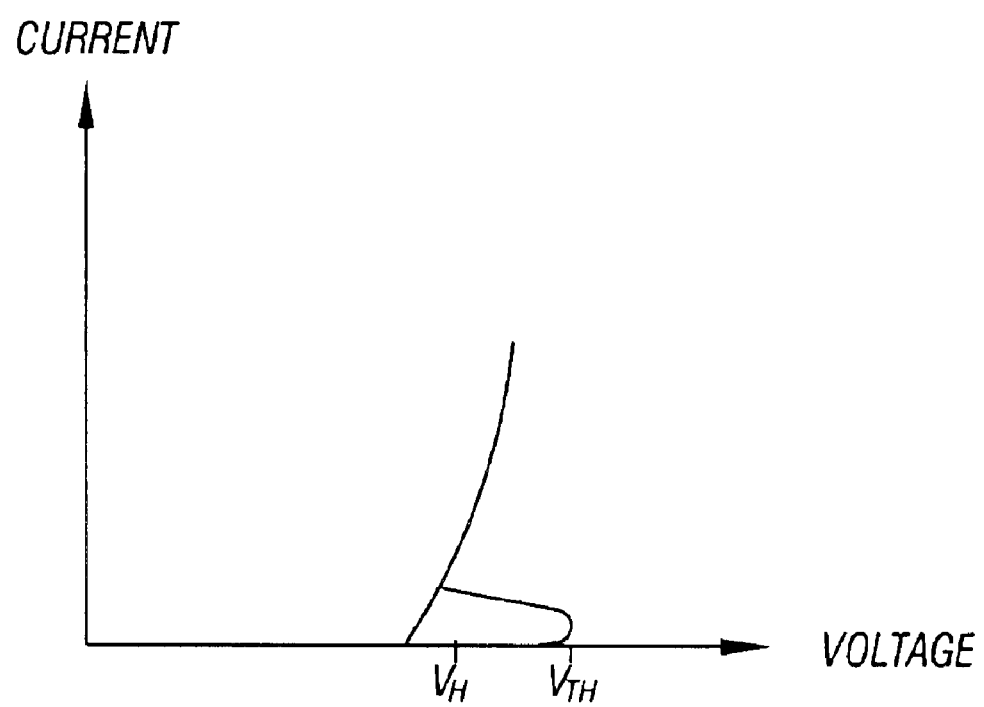
FIG. 19 is a diagram illustrating a current-voltage characteristic of a memory cell.

Turning to FIG. 19, an example of an I-V characteristic of memory cell 115, which may include memory element 130 and select devices 120 and 125 in this embodiment, is shown. The holding voltage of memory cell 115, labeled $V_H$, may result from the holding voltages of select devices 120 and 125 and memory element 130. The threshold voltage of memory cell 115 may be equal to the combined threshold voltages of memory element 130 and select devices 120 and 125.

As may be appreciated from the discussion herein, the threshold voltage of a select device or an ovonic switch may be determined by the thickness or alloy composition of the switching material of the ovonic switch and the holding voltage of an ovonic switch may be determined by the composition of the electrodes contacting the switching material of the ovonic switch. Accordingly, in one embodiment, the snapback voltage, i.e., the voltage difference between the threshold and holding voltages of an ovonic switch, may be reduced by reducing the thickness of the switching material and using a particular type of electrode.

For example, referring to select device 120 illustrated in FIG. 18, if electrodes 930 and 950 are carbon layers and if the thickness of switching material 940 is about 200 Å, then the holding voltage of select device 120 may be about one volt and the threshold voltage of select device 120 may be about 1.2 volts. In this example, the snapback voltage may be about 0.2 volts, which is the difference between the holding and threshold voltages of select device 120.

In the embodiment illustrated in FIG. 18, memory cell 115 may include two ovonic switches serially coupled to an ovonic memory to decrease the voltage difference between the holding voltage and the threshold voltage of a memory cell when higher switching and holding voltages are desired. In other words, rather than using one ovonic switch, two ovonic switches may be serially coupled to an ovonic memory to decrease "snapback" of a memory cell, i.e., reduce the voltage difference between the threshold and holding voltages of an ovonic memory cell when higher switching and holding voltages are desired.

In one embodiment, electrodes 360, 930, and 950 may be carbon, the thickness of switching material 920 may be about 200 Å, and the thickness of switching material 940 may be about 200 Å. In this embodiment, the threshold voltage of select device 120 may be about 1.2 volts and the holding voltage of select device 120 may be about one volt. The threshold voltage of select device 125 may be about 1.2 volts and the holding voltage of select device 125 may be about one volt. If the threshold voltage of reset/set memory element 130 is about 0.8/0.0 volts, then the threshold voltage of memory cell 115 may be about 3.2/2.4 volts for memory cell 115 in a reset state and set state, respectively, which is the combined threshold voltages of memory element 130 and select devices 120 and 125. That is, a voltage potential of greater than about 3.2 volts may be applied across memory cell 115 to "turn on" select devices 120 and 125 and conduct current through memory cell 115. A voltage of greater than about 3.2 volts may be applied across memory cell 115 by applying a voltage potential of greater than about 3.2 volts to column line 142 and a voltage potential of about zero volts to row line 152.

In this example, to program a selected memory cell, e.g., memory cell 115, a voltage of about 1.8 volts may be applied to unselected column and unselected row lines, e.g., lines 141, 143, 151, and 153. A voltage of greater than about 3.2 volts may be applied to a selected column line, e.g., 142, and zero volts may be applied to a selected row line, e.g., row line 152. In this example, after select devices 120 and 125 "turn on," then due to snapback, the voltage drop across memory cell 115 may be reduced from about 3.2 volts to about 2.0–2.8 volts depending on the cell's memory state and current provided by the column. Then, information may be stored in memory element 130 by forcing current through memory cell 115 while assuring that the selected column line remains within about 2.4 volts of the unselected row lines biased at about 1.8 volts so that unselected memory cells are not disturbed. That is, the column may not be allowed to be higher than about 4.2 volts during programming.

FIG. 19 may be used to graphically illustrate this example, wherein for the full memory cell (all 3 components taken together), $V_{TH}$ is 3.2/2.4 volts for a reset state and set state, respectively, and $V_H$ is 2.8 volts. The current through memory cell 115 is near zero amperes until the threshold voltage, $V_{TH}$, of, for example, about 3.2 or 2.4 volts is exceeded, depending on whether the memory cell is in a reset or set state respectively. Then the voltage across memory cell 115 drops to (for a reset bit) or climbs to (for a set bit) the holding voltage, $V_H$, of, for example, about 2.8 volts, as the current is increased.

To read the value of the information stored in the selected memory cell, in this example, a voltage of about 2.8 volts may be applied across memory cell 115. The resistance of memory element 130 may be sensed to determine if memory element 130 is in a low resistance crystalline, "set" state (e.g., less than about 10,000 ohms) or if memory element 130 is in a high resistance amorphous, "reset" state (e.g., greater than about 10,000 ohms).

In another embodiment, to read the value of the information stored in the selected memory cell, a voltage of about 2.8 volts may be applied across memory cell 115 by applying 2.8 volts to the selected column and zero volts to the selected row and 1.4 volts to all other unselected rows and columns. The resistance from the selected column to the selected row may be sensed to determine if memory element 130 is in a low resistance crystalline, "set" state or if memory element 130 is in a high resistance amorphous, "reset" state. In this embodiment, the series select devices may not "turn on" for the case of a reset state, thus also providing a high resistance between the selected column and selected row.

It should be understood that the above examples are not a limitation of the present invention. Other holding voltages and threshold voltages may be achieved to alter the snapback of memory cells by altering the thickness of switching materials 920 and 940 and the compositions of electrodes 360, 930, and 950. One advantage of reducing the snapback of a memory cell is that capacitive displacement current through the memory cell may be reduced, thus reducing the tendency to disturb a bit into a different state while reading.

In other embodiments, memory cell 115 illustrated in FIG. 18 may be arranged differently and include additional layers and structures. For example, it may be desirable to form isolation structures, barrier layers, peripheral circuitry (e.g., addressing circuitry), etc. The memory cell may instead be a ferro-electric or ferro-magnetic material with different phases programmed by different currents or polarity, and that result in different impedances when programmed to the different states. Alternately, the memory cell may be any other material or device benefiting from a small access device. It should be understood that the absence of these elements is not a limitation of the scope of the present invention.

Figure 20:
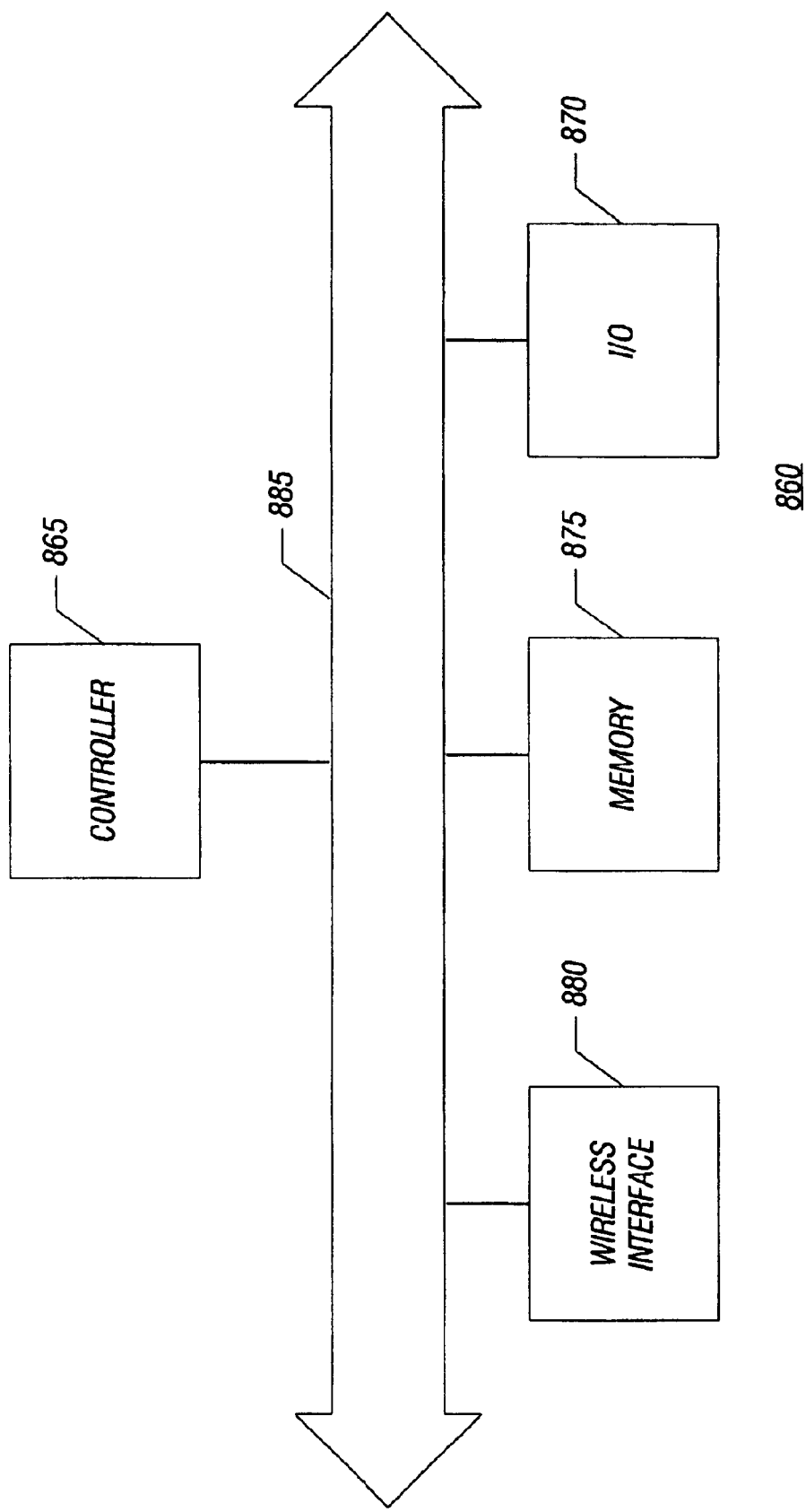
FIG. 20 is a block diagram illustrating a portion of a system in accordance with an embodiment of the present invention.

Turning to FIG. 20, a portion of a system 860 in accordance with an embodiment of the present invention is described. System 860 may be used in wireless devices such as, for example, a personal digital assistant (PDA), a laptop or portable computer with wireless capability, a web tablet, a wireless telephone, a pager, an instant messaging device, a digital music player, a digital camera, or other devices that may be adapted to transmit and/or receive information wirelessly. System 860 may be used in any of the following systems: a wireless local area network (WLAN) system, a wireless personal area network (WPAN) system, a cellular network, although the scope of the present invention is not limited in this respect.

System 860 may include a controller 865, an input/output (I/O) device 870 (e.g. a keypad, display), a memory 875, and a wireless interface 880 coupled to each other via a bus 885. It should be noted that the scope of the present invention is not limited to embodiments having any or all of these components.

Controller 865 may comprise, for example, one or more microprocessors, digital signal processors, microcontrollers, or the like. Memory 875 may be used to store messages transmitted to or by system 860. Memory 875 may also optionally be used to store instructions that are executed by controller 865 during the operation of system 860, and may be used to store user data. Memory 875 may be provided by one or more different types of memory. For example, memory 875 may comprise any type of random access memory, a volatile memory, a non-volatile memory such as a flash memory and/or a memory such as memory 100 discussed herein.

I/O device 870 may be used by a user to generate a message. System 860 may use wireless interface 880 to transmit and receive messages to and from a wireless communication network with a radio frequency (RF) signal. Examples of wireless interface 880 may include an antenna or a wireless transceiver, although the scope of the present invention is not limited in this respect.

Although the scope of the present invention is not limited in this respect, system 860 may use one of the following communication air interface protocols to transmit and receive messages: Code Division Multiple Access (CDMA), cellular radiotelephone communication systems, Global System for Mobile Communications (GSM) cellular radiotelephone systems, North American Digital Cellular (NADC) cellular radiotelephone systems, Time Division Multiple Access (TDMA) systems, Extended-TDMA (E-TDMA) cellular radiotelephone systems, third generation (3G) systems like Wide-band CDMA (WCDMA), CDMA-2000, or the like.

It shall be further understood that the ovonic memory has a substantial dynamic range that, with the techniques used above and if necessary with feedback that can be realized by one reasonably skilled in the art, the physical memory cell may store more than one bit by writing and reading more than two non-overlapping ranges of resistance.

While certain features of the invention have been illustrated and described herein, many modifications, substitutions, changes, and equivalents will now occur to those skilled in the art. It is, therefore, to be understood that the appended claims are intended to cover all such modifications and changes as fall within the true spirit of the invention.

What is claimed is:

1. An apparatus, comprising:
   a memory element;
   a first access device coupled in series to the memory element, wherein the first access device comprises a first chalcogenide material; and
   a second access device coupled in series to the first access device, wherein the second access device comprises a second chalcogenide material.

2. The apparatus of claim 1, wherein the first access device, the second access device, and the memory element are formed using thin film materials.

3. The apparatus of claim 1, wherein the second access device is over the first access device, and the first access device is over the memory element.

4. The apparatus of claim 1, wherein the first chalcogenide material is adapted to be repeatedly and reversibly switched between a higher resistance state and a relatively lower resistance.

5. The apparatus of claim 1, wherein the memory element comprises a phase change material that is capable of being programmed into one of at least two memory states by applying a current to the phase change material to alter the phase of the phase change material between a substantially crystalline state and a substantially amorphous state, wherein a resistance of the phase change material in the substantially amorphous state is greater than the resistance of the phase change material in the substantially crystalline state.

6. The apparatus of claim 1, wherein the memory element comprises a memory material over a substrate and wherein the first chalcogenide material is over the memory material and the second chalcogenide material is over the first chalcogenide material.

7. The apparatus of claim 6, further comprising:
   a first electrode between the memory material and the first chalcogenide material; and
   a second electrode between the first chalcogenide material and the second chalcogenide material.

8. The apparatus of claim 7, wherein the first electrode and the second electrode are thin films of carbon.

9. The apparatus of claim 6, wherein the first chalcogenide material, the second chalcogenide material, and the memory material each comprise tellurium.

10. The apparatus of claim 6, wherein the first chalcogenide material is a material selected from the group consisting of silicon, tellurium, arsenic, germanium, and combinations thereof.

11. The apparatus of claim 6, wherein the memory material is a tellurium, antimony, germanium alloy.

12. The apparatus of claim 1 wherein the first and second chalcogenide materials are substantially the same.

13. The apparatus of claim 1 wherein the first and second chalcogenide materials are different.

14. The apparatus of claim 1 wherein said memory element includes a third chalcogenide material.

15. The apparatus of claim 14 wherein said third chalcogenide material is different than said first and second chalcogenide materials.

16. A system, comprising:
   a processor; and
   a memory coupled to the processor, the memory including;
      a memory element;
      a first access device coupled in series to the memory element, wherein the first access device comprises a first chalcogenide material; and
      a second access device coupled in series to the first access device, wherein the second access device comprises a second chalcogenide material.

17. The system of claim 16, wherein the memory element comprises a memory material over a substrate and wherein the first chalcogenide material is over the memory material and the second chalcogenide material is over the first chalcogenide material.

18. The system of claim 16, wherein the memory further comprises a vertical structure over a substrate, wherein the vertical structure comprises the first access device, the second access device, and the memory element serially coupled to each other.

19. The system of claim 16 including a wireless interface coupled to said processor.

20. The system of claim 16 wherein the first and second chalcogenide substantially the same.

21. The system of claim 16 wherein the first and second chalcogenide materials are different.

22. The system of claim 16 wherein said memory element includes a third chalcogenide material.

23. The system of claim 22 wherein said third chalcogenide material is different than said first and second chalcogenide materials.

* * * * *